United States Patent [19]
Osofsky et al.

[11] Patent Number: 5,872,368
[45] Date of Patent: Feb. 16, 1999

[54] METHOD OF CONTROLLING A SUPER CONDUCTOR

[75] Inventors: Michael Osofsky, Burtonsville; Robert J. Soulen, Jr., Rockville, both of Md.; Raymond Auyeung, Alexandria; James S. Horwitz, Fairfax, both of Va.; Doug B. Chrisey, Bowie, Md.; Mark Johnson, Springfield, Va.

[73] Assignee: The United States of America as represented by the Secretary of the Navy, Washington, D.C.

[21] Appl. No.: 565,487

[22] Filed: Nov. 30, 1995

[51] Int. Cl.$^6$ ............................ H01L 29/06; H01L 39/22
[52] U.S. Cl. ........................ 257/34; 505/190; 505/310; 505/329; 505/726; 505/842
[58] Field of Search ................................ 257/31, 32, 33, 257/35, 36, 37, 38; 505/190, 193, 220, 235, 310, 329, 702, 706, 726, 842, 874

[56] References Cited

U.S. PATENT DOCUMENTS 5,432,373   7/1995   Johnson et al. ........................... 257/421

OTHER PUBLICATIONS

Clinton et al. "Mesoscopic Magnetoquenched Superconductive Value", Appl. Phys. Lett., vol. 70, No. 9, pp. 1170–1172, Mar. 3, 1997.

Vas'ko et al., "Critical Current Suppression in a Superconductor bu Injection of Spin–Polarized Carriers from a Ferromagnet", Physical Review Letters, vol. 78, No. 6, pp. 1134–1137, Feb. 2, 1997.

Tedrow et al., "Spin Polarization of Electrons Tunneling from Films of Fe, Co, Ni, and Gd", Physical Review B, vol. 7, No. 1, pp. 318–326, Jan. 1, 1973.

Dessau, Daniel S., Colossal Magnetoresistive Oxides, *Abstract*–SRC–Workshop 97.

"Transport Properties of YBa$_2$Cu$_3$O$_7$–$\delta$/Ferromagnetic Interfaces", Haas et al., *Physica C*, 235–240 (1994) pp. 1905–1906.

"Quasiparticle–Injection–Induced Superconducting Weak Links," Wong et al., *Phys. Rev. Let.*, vol. 37, No. 3, 19 Jul. 1976, pp. 150–153.

"High–Tc Transistor", Manhart, J., preprint, *Superconductor Science and Technology* (Jul. 28, 1995).

Wong, et al. *IEEE Trans. on Magn.* vol. MAG–13, No. 1, Jan. 1977, pp. 743–745. "Controllable Superconducting Weak Link,".

"Spin Coupled Resistance Observed in Ferromagnet–Superconductor–Ferromagnet Trilayers", Johnson, M., Applied Phys. Lett. 65, vol. No. 11 Sep. 12, 1994, pp. 1460–1462.

Primary Examiner—Carl W. Whitehead, Jr.
Assistant Examiner—Alice W. Tang
Attorney, Agent, or Firm—Tom E. McDonnell; Barry A. Edelberg

[57] ABSTRACT

The order parameter of a superconductor is reduced by injecting spin-polarized carriers into the superconductor. The reduction in the order parameter is used to modulate the critical current of the superconductor. In a typical embodiment, a current is caused to flow through a superconductor. Spin polarized electrons are then injected into the path of the current in the superconductor by biasing a magnetic metal with respect to a terminal of the superconductor. The bias current may be varied to modulate the injection and thus the flow of current through the superconductor.

24 Claims, 6 Drawing Sheets

METHOD OF CONTROLLING A SUPER CONDUCTOR

BACKGROUND OF THE INVENTION

1. Field of the Invention

The present invention relates generally to superconducting devices and more specifically to superconducting devices modulated by a controllable weak link.

2. Description of the Background Art

Superconducting materials have found uses in devices such as amplifiers, logic devices, Josephson junctions and switches. For superconducting materials to be useful in these and other devices, it is desirable to control or otherwise modulate their superconducting properties. This control has been typically accomplished by forming a weak link in the superconducting material. At a weak link, the ability of the superconducting material to carry current is significantly reduced with respect to the remaining bulk of the superconductor.

Weak links can be fixed or variable. A weak link formed by reducing the width and/or thickness of a selected portion of a superconducting film is fixed. That is, the size of the weak link cannot be readily altered. Other fixed weak links include superconductor-normal (non-superconducting) metal-superconductor junctions and the superconducting point contact.

Fixed weak links have also been formed by overcoating a narrow strip of a superconductor with a non-superconducting metal. The non-superconducting metal weakens the superconductivity of the overlaying portion of the superconductor.

Variable weak links, in which the characteristics of the weak link can be readily adjusted, are desirable because they offer the ability to modulate the superconducting current across the link. Previously, variable weak links have been created by injecting current from a non-magnetic and non-superconducting metal into a small region along a superconducting wire, strip or film. These unpolarized carriers minimally disrupt the singlet ground state (paired spin up and spin down carriers) in the superconductor. Also, the injection of unpolarized carriers changes the relative population of spin-paired and unpaired carriers, thus reducing the critical current of the superconductor.

The reduction in superconducting current created by this conventional injection of non-spin polarized carriers, however is small and the gain is therefore low. A superconducting device in which the size and critical current density of the weak link can be better modulated and/or tuned and thus provide higher gain is desirable.

Others have shown that, in a bilayer consisting of a spin-polarized material and a conventional superconductor, the polarization of the spin-polarized carriers penetrates the interior of the superconductor. Previously, however, no one has suggested the injection of spin-polarized carriers, or the use of other spin-polarization phenomena, to suppress the order parameter, and thus control the conductivity, of a superconductor.

SUMMARY OF THE INVENTION

Accordingly, it is an object of this invention to provide a variable weak link.

It is a further object of the present invention to produce a weak link that may be strongly modulated and provide a high gain relative to that of the prior art.

These and additional objects of the invention are accomplished by modulating the order parameter of a superconductor using spin polarization phenomena.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein:

FIG. 3b schematically illustrates a cross-section of a preferred embodiment similar to, but varying somewhat from, the device shown in FIGS. 2 and 3a.

FIG. 7 is qualitative, no numerical values are provided along the axes.

DESCRIPTION OF THE PREFERRED EMBODIMENTS

In a three-terminal embodiment of the present invention, a superconducting wire, strip or film is connected to two terminals that are electrically biased with respect to each other. At some point along the superconducting path between the terminals, a spin injection material is electrically connected to the superconducting wire, strip or film. As used throughout the present specification and claims, the term "spin injection material" describes a material that is capable of producing spin-polarized current. The spin-polarized current can be a tunneling current (through an insulator layer) or an ohmic current (through a metallic metal layer). As used throughout the present specification and claims, the term "electrical current" includes tunneling current and ohmic current.

Typical spin-injection materials include non-magnetic metal/spin filter structures and magnetic materials such as ferromagnetic materials (with itinerant carriers having net spin polarization). In the non-magnetic metal/spin filter structure, the spin filter (for example, a ferromagnetic insulator such as EuO or EuS) induces a spin-polarized current through its tunneling characteristics, thus converting the unpolarized current from the metal into a spin-polarized tunneling current. In addition to ferromagnetic insulators, some double exchange materials (such as the ferrimagnetic material magnetite) may also be used as spin filters.

The spin injection material is electrically biased with respect to one of the terminals, so that the spin-polarized carriers from the magnetic material flow into the superconductor. The electrical bias between the spin-injection material and the superconducting terminal may then be modulated to control the injection of spin-polarized carriers into the superconductor.

According to modern theories of superconductivity, in the ground state of a superconductor, pairs of Fermi level carriers having antiparallel spins unite in bound pairs (Cooper pairs). The order parameter $\psi$ of a superconductor describes the density of superconducting pairs in a superconductor. Suppressing the order parameter diminishes the superconductivity of a superconductor. For example, suppressing the order parameter in a portion of the thickness of a superconducting layer reduces the superconducting current that can flow along that superconducting layer.

The injection of a significant number of spin-polarized carriers, for example electrons or holes, into a superconductor disrupts the ordering of charge carriers within the superconductor. The disruption strongly suppresses the order parameter of the superconductor, thus forming a weak link. The size of the weak link (in this case, the volume or area of the superconductor in which the order parameter has been strongly suppressed, perhaps even to zero or near zero) varies with the depth to which the spin-polarized carriers penetrate the superconductor.

The polarization of the spin injected current penetrates to a depth $l_{spin}$ into the superconductor. This length is determined by the spin-flip scattering rate, $\tau_{spin-flip}$:

$$l_{spin} = \sqrt{D t_{spin-flip}}$$

where $D=\frac{1}{3}v_f^2\tau_{el}$, $v_f$ is the Fermi velocity, and $\tau_{el}$ is the elastic scattering time. For this penetration into the superconductor to be maximized, the interface between the two materials, and the superconducting material, must be free of spin-flip scatterers. Spin-flip scatterers include magnetic impurities. For example, in many high temperature cuprate superconductors, care must be taken to ensure essentially complete oxidation of Cu. Otherwise, magnetic $Cu^{2+}$ impurities will significantly hamper the usefulness of the present invention.

The invention may also be used with, for example, a four terminal device. Typically, in a four-terminal device, the two terminals of the superconductors are biased with respect to each other so that superconducting current flows from one end of the superconductor to the other. The spin injection material is in electrical contact with the superconductor at a third terminal. A fourth terminal is positioned opposite the third terminal. This fourth terminal is electrically biased with respect to the third terminal so that spin-polarized current flow into and completely across the superconducting material from the third terminal to the fourth terminal, transverse to the flow of superconducting current between the first and second terminals. A four-terminal device will suppress the order parameter and conductivity of the superconductor in a manner analogous to that described above with respect to a three-terminal device.

Any superconductor, including high $T_c$ superconductors (HTS) and low $T_c$ superconductors (LTS), may be used in the method of the present invention. Nevertheless, because the carrier concentration of the high $T_c$ superconductors (HTS) are approximately 10 to 100 times less than conventional LTS superconductors, the injection of excess spins should introduce a proportionately larger polarization, and thus larger reduction of the order parameter, in the HTS. Typical useful HTS superconductors include rare earth barium cuprates and mixed oxides of barium, strontium, calcium and copper. Known families of useful superconductors include YBaCuO, Tl(Ba,Sr)CaCuO, Hg(Ba,Sr)CaCuO, BiSrCaCuO, and NdCeCuO. These families of superconductors include mixed oxides of the recited elements, in various proportions and oxygen content sufficient to provide superconductivity. Typical useful LTS superconductors include Nb, NbTi, NbN, and $Nb_3Sn$.

Any electrically conductive material where carriers have a net magnetic spin may be used as the magnetic material in the present invention. Preferably, the magnetic material in the present invention is a ferromagnetic material. Typical ferromagnetic materials useful in the present invention include iron, iron-based alloys (such as $Re_2Fe_{14}B$ and other, more conventional magnetic iron-based alloys such as permalloy), nickel, nickel-based alloys, cobalt and cobalt-based alloys, SmCo, and colossal magnetoresistive materials such as LaCaMnO. In some applications, nickel and some nickel-based alloys, because of their small polarization, may be somewhat less desirable ferromagnetic materials than the other listed materials. Typical useful spin filters include EuO, $CrO_2$, EuS, and magnetite. Where a metal/spin filter structure is used, any conductive nonmagnetic or magnetic metal with no flip scattering may be used. Typical conductive, nonmagnetic metals include gold, silver, aluminum, platinum, copper, and mixtures thereof.

The spin injection material may be in physical contact with the superconductor (i.e., a magnet/superconductor structure) or may be separated from the superconductor by a thin layer of an insulator (magnet/insulating buffer layer/superconductor structure) or by a thin layer of normal, non-magnetic metal, such as Au (magnet/conductive buffer layer/superconductor structure). In the magnet/insulator/superconductor structure and in the metal/spin insulator/superconductor structure, the electrical current from the spin injection material to the superconductor results from tunneling. In non-magnetic metal/spin insulator/superconductor structure, the metal/spin insulator bilayer form the spin injection material. Where the magnet/insulator/superconductor structure, the insulator layer, the magnet layer forms the spin injection layers, while the insulator layer forces the spin injection to occur via tunneling. In the magnet/conductive buffer layer/superconductor structure, the non-magnetic buffer layer prevents undesired chemical reaction between the magnetic material and the superconductor. This buffer layer may be a nonmagnetic electrically conductive substance, for example a metal such as gold, silver, aluminum or a mixture thereof. Alternatively, the buffer layer may be a magnetic electrically conductive substance that is chemically compatible with the superconductor and the magnetic material, but has less desirable magnetic characteristics than the magnetic material.

Figure 1:
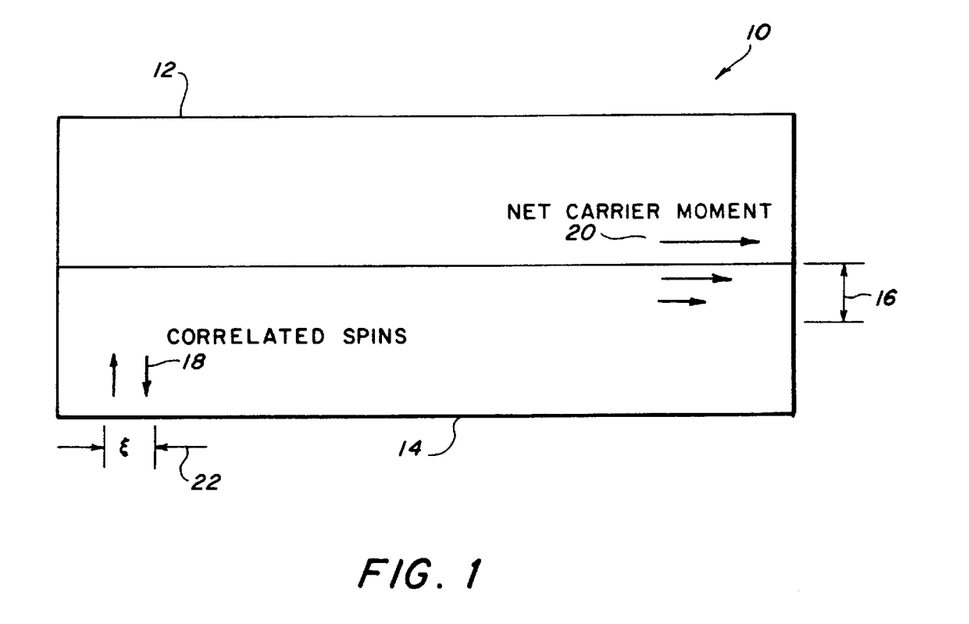
FIG. 1 schematically illustrates a three-terminal device according to a preferred embodiment of the present invention.

FIG. 1 schematically shows a spin injection material superconductor junction 10 between magnetic material 12 and a high temperature superconductor 14. In the ground state of superconductor 14, distal to the interface between magnetic material 12 and high temperature superconductor 14, the spins of the Fermi level carriers are correlated (i.e., paired) in an up-down configuration as shown by vertical single-headed arrows 18. This correlation extends over the coherence length ξ highlighted by horizontal arrows 22. Magnetic material 12, however, has a net carrier moment as shown by the uppermost arrow of arrows 20. The flow of carriers having this net moment into superconductor 14 introduces a net carrier moment in the adjacent portions of superconductor 14. This net carrier moment extends into superconductor 14 for the spin diffusion length shown by double-headed arrow 16. As shown by the two lowermost arrows 20, the magnitude of the moment introduced into superconductor 14 decreases with increasing distance from the interface between magnetic material 12 and superconductor 14. Throughout the spin diffusion length of the junction between magnetic material 12 and superconductor 14, pairing of the carriers in superconductor 14 is disrupted. The critical supercurrent of superconductor 14 is thus reduced in that region.

Figure 2:
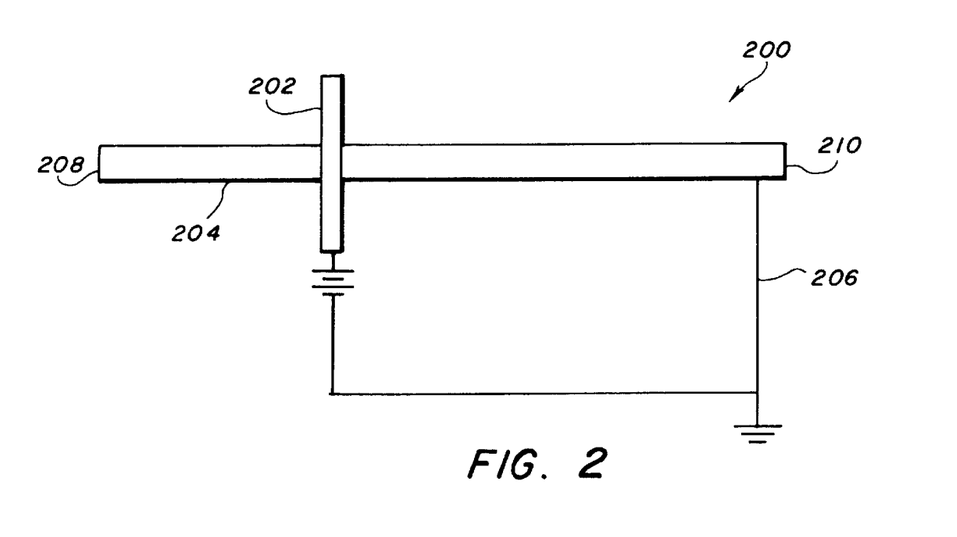
FIG. 2 schematically illustrates a top view of preferred embodiment of the present invention.

FIG. 2 schematically illustrates a top view of a simple version of the spin injection section 200 of a three terminal device according to the present invention. As shown in FIG. 2, thin film magnetic stripe 202 is deposited over thin film superconducting stripe 204. Biasing circuit 206 biases thin film magnetic stripe 202 with respect to thin film superconducting stripe 204 so that spin-polarized current flows from thin film magnetic stripe 202 into superconducting stripe 204. In the complete three terminal device, end 208 of superconducting stripe 204 is electrically biased with respect to its grounded end 210 so that superconducting current I (FIGS. 3a and 3b) flows from end 208 to end 210. If desired, a buffer layer (212 in FIG. 3a, not visible in FIG. 2) of a non-magnetic metal, such as gold, silver, or platinum may be interposed between magnetic stripe 202 and superconducting strip 204.

Figure 3A:
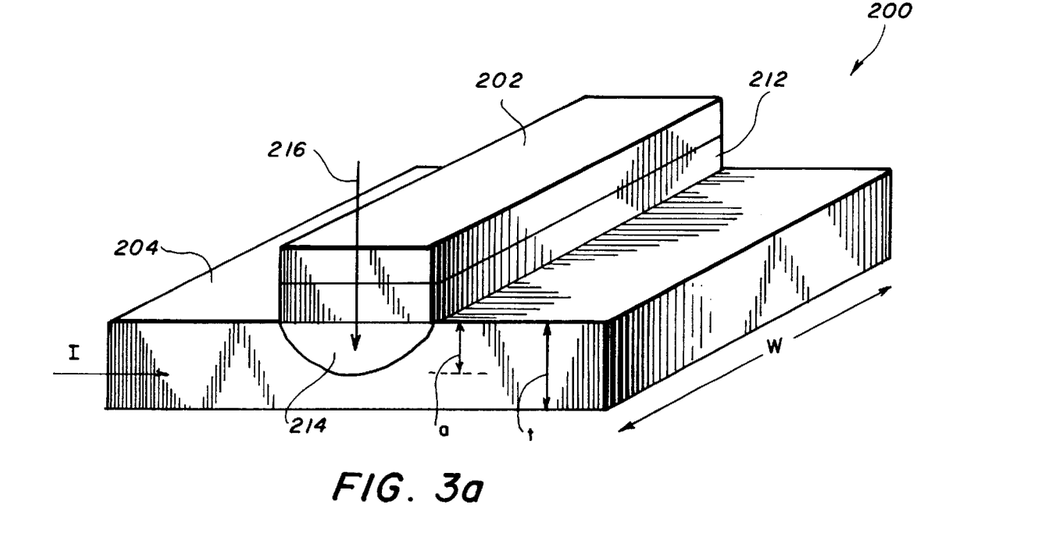
FIG. 3a schematically illustrates a cross-section of the device shown in FIG. 2.

FIG. 3a shows a cross-section view of device 200 shown in FIG. 2. Spin polarized carrier are injected from magnetic stripe 202, through optional buffer layer 212, into superconductor stripe 204, in the direction shown by arrow 216. FIG. 3a clearly shows region 214 of superconductor stripe 204 into which the spin-polarized carriers from magnetic stripe 202 have diffused. Region 214 extends, at its maximum depth, a depth a into the thickness t of superconductor stripe 204. In region 214, the order parameter ψ of superconductor stripe 204 is disrupted. As a result, the critical supercurrent across superconductor stripe 204 is reduced.

Figure 3B:
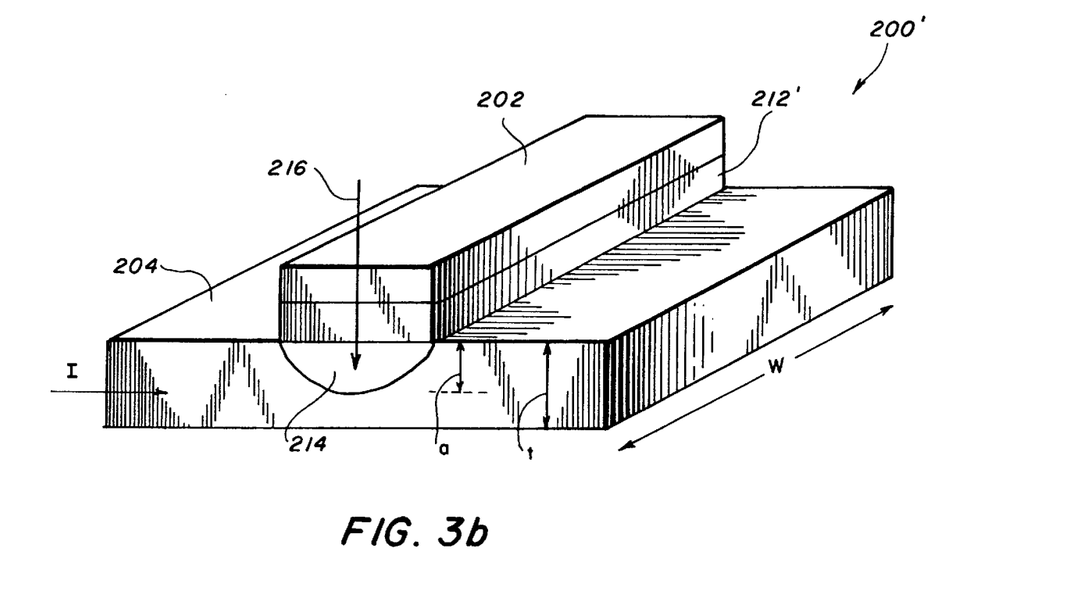

FIG. 3b shows a cross-section view of device 200' analogous to device 200 shown in FIG. 3a, with like components bearing the same identifying numerals as used in FIG. 3a. In device 200', however, layer 202' is a nonmagnetic metal and stripe 212' is a required spin filter layer. Layer 212' must be sufficiently thin to allow the preferential tunneling of carriers having one spin from nonmagnetic metal stripe 202' into superconductor stripe 204. As a result of this preferential tunneling, the tunneling current is spin polarized. Except as stated above, the device functions as described with reference to FIG. 3a.

Figure 4:
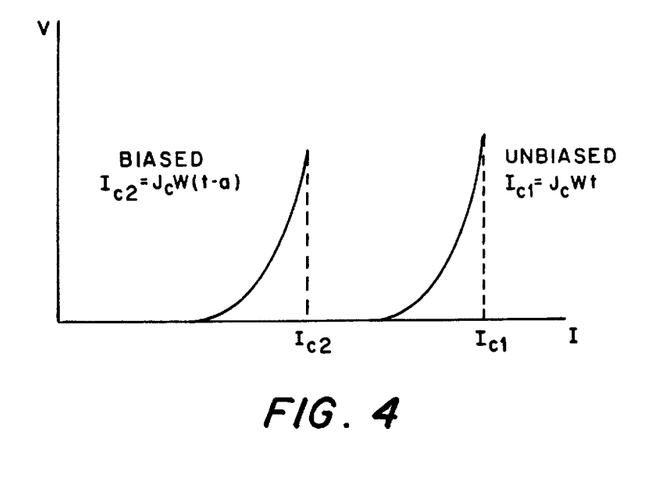
FIG. 4 is a graph comparing the qualitative I–V characteristics of a generic three-terminal device according to the present invention in a biased and an unbiased state. Because the graph is qualitative, numerical values for I and V are not supplied along the I or V axes. Values for I and V along their respective axes increase with increasing distance from the intersection of the axes.

FIG. 4 schematically illustrates how a bias current affects the I–V characteristics of the superconductor of in a device as illustrated in FIG. 3a. As shown in FIG. 4, the application of a bias current shifts the I–V curve to the left.

Generally, the net spin polarization near the interface increases with increasing bias current. As the net spin polarization increases, the depth a to which the superconductivity of superconductor stripe 204 is effectively squelched also increases. In an unbiased device as shown in FIG. 3a:

$$I_{c1}=J_cW(t),$$

where $I_{c1}$ is the superconducting current across superconductor stripe 204 in an unbiased state, $J_c$ is the critical current of the superconductor in superconducting stripe 204, W is the width of superconducting strip 204, and t is the thickness of superconducting strip 204. In a biased device:

$$I_{c2}=J_cW(t-a),$$

where $I_{c1}$ is the superconducting current across superconductor stripe 204 in a biased state, a is the depth to which superconductivity in superconducting stripe 204 is effectively squelched, and $J_c$, W and t are as defined above.

Figure 5:
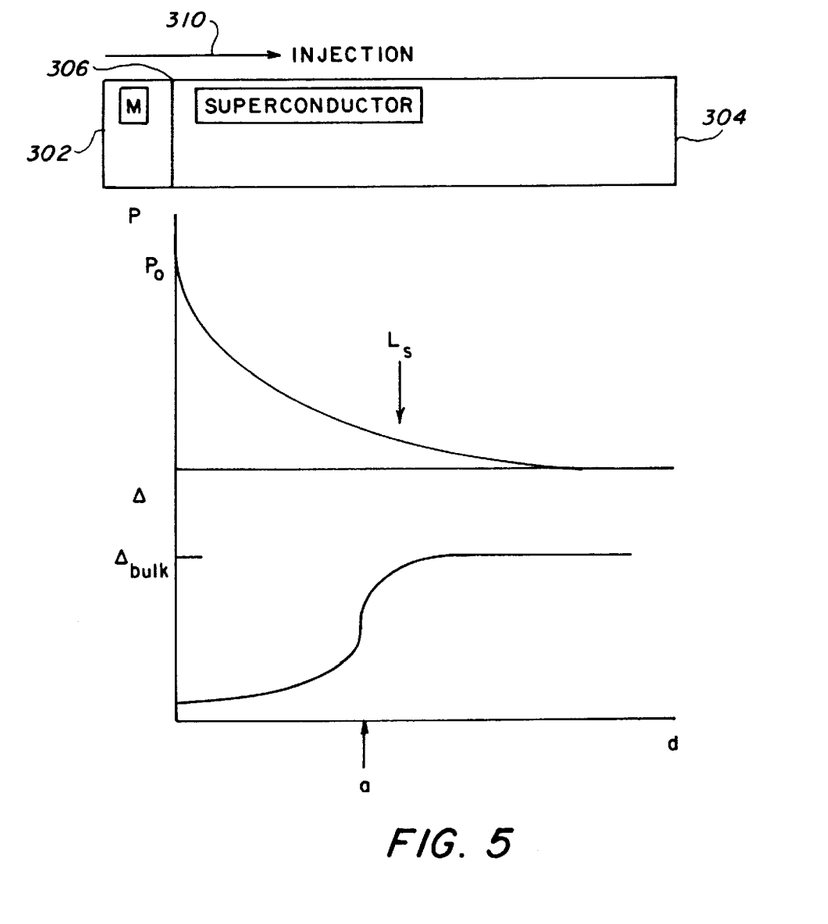
FIG. 5 qualitatively shows, by use of aligned charts and graphs, the relationship between the distance from the interface between a spin injection material and a superconductor and the superconducting properties of the superconductor. Within each graph, the values of the variables labeled along each axis increase with increasing distance from the intersection of the axes. Because

Because of the alignment of the charts within it, FIG. 5 schematically shows the spatial relationships between the magnetic material 302, superconductor 304, the net spin polarization P of carriers in superconductor 304, (where $P=P_0e^{-d/L_S}$, $P_0$ is the polarization at interface 306 between superconductor 304 and magnetic material 302 and the other factors are as described below), the distance d from interface 306 between magnetic material 302 and superconductor 304, the spin diffusion length $L_s$, the energy gap Δ of the carrier in superconductor 304 ($\Delta_{bulk}$ is the energy gap of the carriers within superconductor 304 the superconducting state), and the depth a within superconductor 304 from interface 306 in which superconductivity is effectively squelched. Carriers are injected into superconductor 304 in the direction of arrow 310. The top graph of FIG. 5 schematically shows P vs. d, where the spin diffusion length $L_S$ of the carriers is marked with a down arrow. The bottom half of FIG. 5 schematically plots Δ vs d. The depth a from interface 306 over which the superconductivity of superconductor 304 is effectively squelched is marked by an up arrow.

Figure 6:
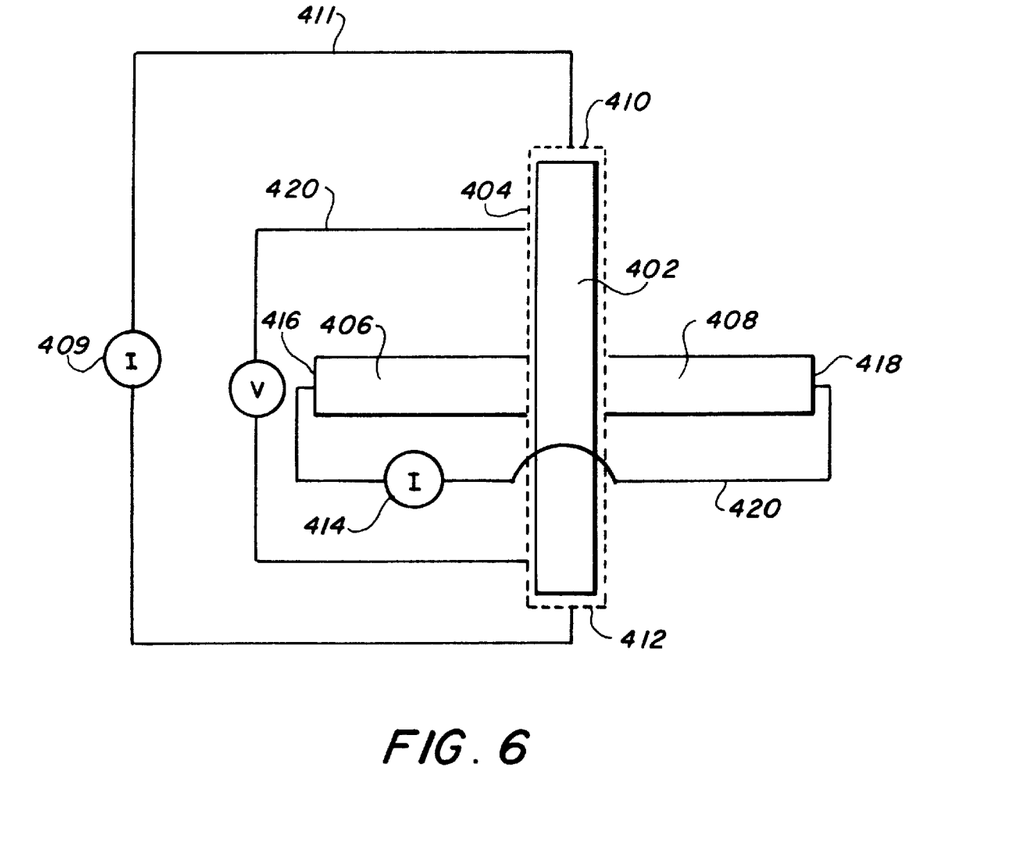
FIG. 6 schematically illustrates an alternative embodiment of the present invention.

FIG. 6 schematically shows another embodiment of the present invention. Superconductor stripe 402 is coated with gold coating 404. First stripe 406 of conductive magnetic material and second stripe 408 of electrically conductive magnetic material are linearly aligned with respect to each other and are essentially perpendicular with respect to superconductor stripe 402. Stripe 406 and 408 physically and electrically contact gold coating 404. Current generator 409 provides a superconducting current between ends 410 and 412 of superconductor stripe 402, by virtue of the biasing current provided along line 411. Current generator 414 provides an electrical current between end 416 of conductive magnetic material stripe 406 and end 418 of conductive magnetic material stripe 408 by virtue of the biasing current provided along line 420.

Superconductor stripe 402 serves as a path of least resistance for carriers injected into the gold coating 404. Thus, spin-polarized charge carriers injected from conductive magnetic material stripe 406 are injected into superconducting stripe 402. These spin-polarized charge carriers suppress the order parameter ψ in the region of the superconductor stripe 402 near the intersection of conductive magnetic material stripe 406 with gold coating 404. At the same time, oppositely charged spin-polarized carriers are injected into superconducting stripe 402 from conductive magnetic material stripe 408, through gold coating 404. The injection of these opposite charged spin-polarized carriers suppresses the order parameter ψ in the near the intersection of conductive magnetic stripe 408 with gold coating 404. Thus, the embodiment of FIG. 6 suppress the order parameter at two locations within the superconductor, thus further limiting the critical current along superconducting stripe 402.

Figure 7:
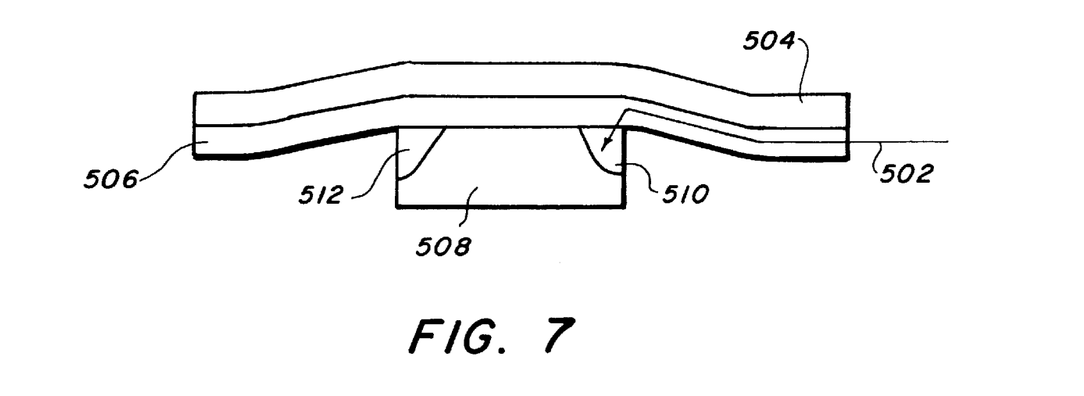
FIG. 7 schematically illustrates the phenomenon of shunting. The phenomenon is largely overcome by the embodiment described in FIG. 6.

In the embodiment of FIG. 6, the gold contacts the spin injection material only at along those regions where the gold also contacts the superconductor. This arrangement prevents the undesirable shunting of polarized charge carriers. FIG. 7 illustrates the shunting of polarized charge carriers in an embodiment of the invention where a buffer layer is provided as a coating on the surface of a magnetic material. As shown by arrow 502 in FIG. 7, spin-polarized charge carriers travel from spin injection material layer 504 along the plane of gold buffer layer 506 before traveling into the superconductor stripe 508. As they travel along the plane of gold buffer layer 506, a portion of the polarized charge carriers depolarize. Additionally, the injection of spin-of spin-polarized charge carriers into the superconductor, and the resulting suppression of the order parameter of the superconductor, are limited to regions 510 and 512, where superconductor stripe 508 first contacts gold buffer layer 506. Thus, shunting reduces both the quantity of spin-polarized carriers injected into the superconductor and the area of the superconductor over which superconductivity is suppressed. Shunting, and draining only at the edge of the superconductor, can also be suppressed or prevented, in all embodiments where it may be a problem, by interposing a highly resistive layer, such as a semiconductor or a semimetal, between the conductive spin-injection material and the superconductor.

Figure 8:
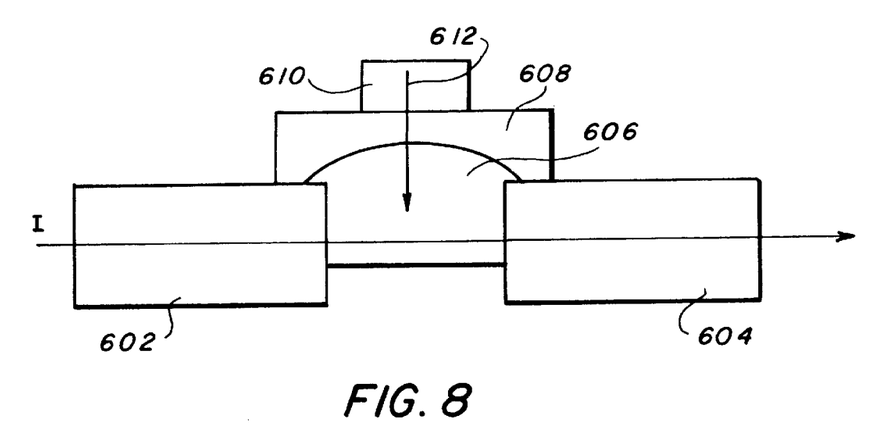
FIG. 8 schematically illustrate a Josephson junction incorporating an embodiment of the present invention.

The present invention is also useful in controlling pre-existing weak links, as schematically shown in FIG. 8. In FIG. 8, a Josephson junction is formed by sections 602 and 604 of non-granular superconductor joined by of section 606 of granular superconductor. The granular superconductor may be, for example, superconductor-normal metal-superconductor (SNS) or superconductor-insulator-superconductor (SIS). Buffer layer (e.g., gold) 608 overcoats granular superconductor 606 and extends slightly past the upper edges of superconductor sections 602 and 604. Spin injection material 610 rests on the upper surface of buffer layer 608. Superconductor sections 602 and 604 are electrically biased with respect to each other so that current flows in the direction shown by arrow I. Spin-injection material 610 is then electrically biased with respect to the device (either end, or a fourth terminal (not shown) to injection spin-polarized charged carrier into granular superconductor 606, as shown by arrow 612. Because weak links, such as those formed by the use of (and present in) granular superconductors have fewer paired spin-up and spin-down carriers, the number of paired carrier states that must be disturbed is lower than that needed to noticeably suppress the superconductivity of a continuous or grain-free superconductor. Thus, the present invention is particularly useful in controller weak links in a granular superconductors regardless of whether the granular superconductor is incorporated into a Josephson junction. Of course, the method of the present invention may still be used to control a Josephson junction where the pre-existing weak link is formed by a continuous or grain-free superconductor, or may be used to create the weak link in a Josephson junction.

A device according to the present invention may be constructed using any fabrication method known in the art. These methods include, but are not limited to microlithography, pulsed laser deposition, molecular beam epitaxy, sputtering, chemical vapor deposition, and combinations thereof.

Having described the invention, the following examples are given to illustrate specific applications of the invention including the best mode now known to perform the invention. These specific examples are not intended to limit the scope of the invention described in this application.

EXAMPLES

Figure 9:
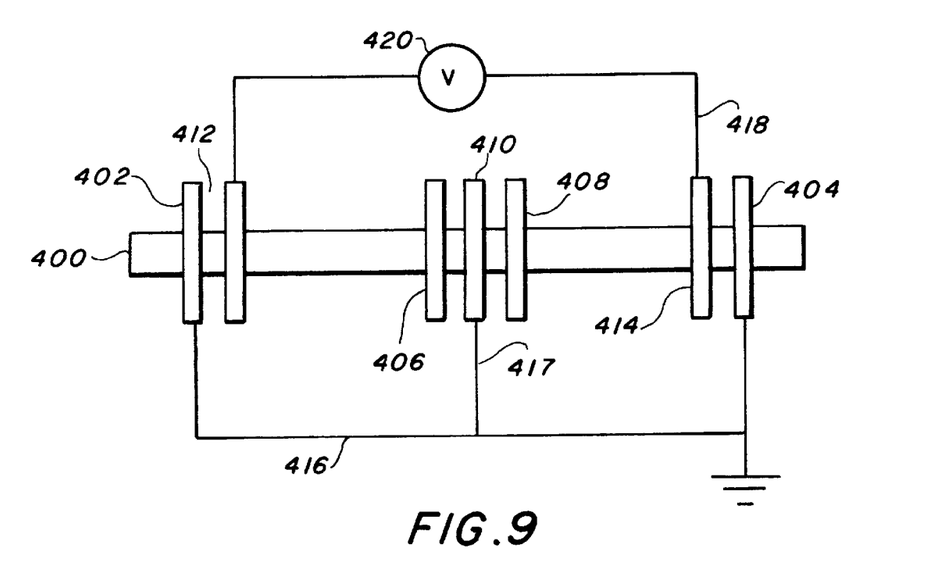
FIG. 9 shows a generic geometry for a test device constructed in accordance with the present invention.

A sample was constructed using the generic device geometry shown in FIG. 9, and YBCO as the superconducting material. That sample was constructed according to the following specifications:

| | |
|---|---|
| YBCO width: | 1 mm |
| YBCO thickness: | ≈4000 Å |
| bias contacts | permalloy (PM)/Au and Au (control contact) |
| Au buffer thickness | ≈200 Å |
| bias contact width | 0.4 mm |
| $T_c$ (R = 0) | ≈88K |

Figure 10:
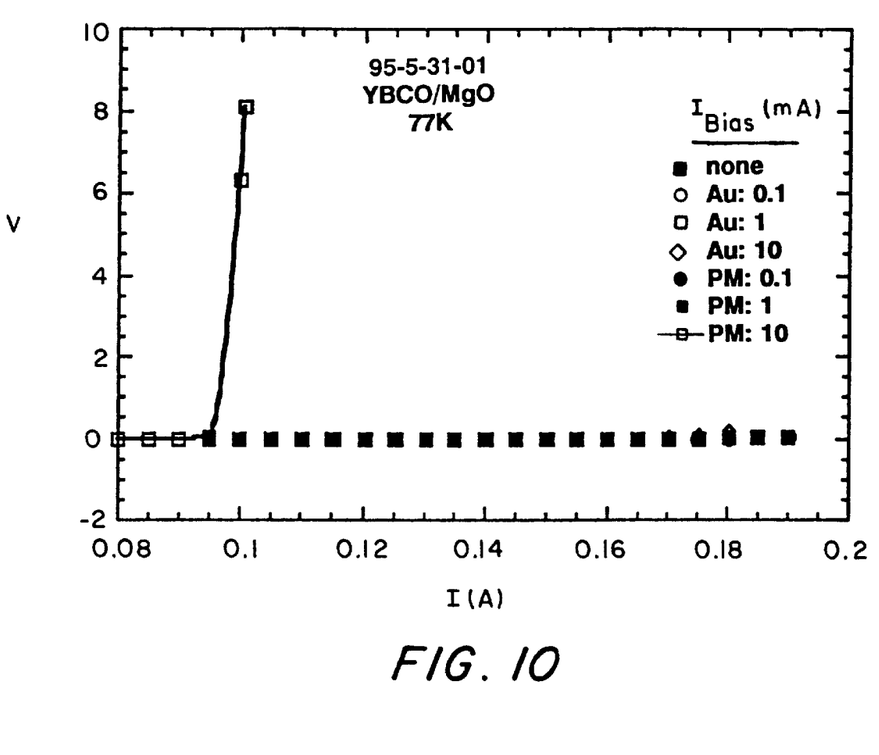
FIG. 10 graphically illustrates the I–V curves obtained for the application various bias currents across various contacts in a device according to the present invention.

A series of specified bias current were then applied between the superconductor and either the Au contact or the permalloy/Au contact. The I–V curve obtained at each bias applied is shown in FIG. 10. In FIG. 10, the superconducting current was applied across superconductor 400 between Au contacts 402 and 404. The bias current was applied, as appropriate for each experiment, across either Au control contact 406, Ni/Au buffer layer contact 408, or permalloy/Au buffer layer contact 410, using lines 416 and 417. For each experiment, line 417 was placed in electrical contact with either of Au control contact 406, Ni/Au buffer layer contact 408, or permalloy/Au buffer layer contact 410 as appropriate. The voltage was measured along line 418 across contacts 412 and 414 using voltameter 420. The bias currents for each curve of FIG. 10 were as listed in Table 1:

TABLE 1

| Contact type: | $I_{bias}$ (mA) |
|---|---|
| ■ | none |
| ○ | Au:0.1 |
| □ | Au:1 |
| ◇ | Au:10 |
| ● | PM:0.1 |
| ■ | PM:1 |
| ⊞ | PM:10 |

The results illustrated in FIG. 10 show that spin injection from the PM/Au buffer contact significantly decreased the $I_c$ of the superconductor for bias current of greater than 10 mA.

Obviously, many modifications and variations of the present invention are possible in light of the above teachings. It is therefore to be understood that, within the scope of the appended claims, the invention may be practiced otherwise than as specifically described.

What is claimed is:

1. A method for modulating a superconducting current in at least one region of a superconductor having paired spin-up and spin-down charge carriers, comprising the step of suppressing the order parameter within said at least one region of said superconductor by injecting spin-polarized charge carriers into said at least one region of said superconductor.

2. A method of suppressing the superconductivity of a superconducting material, comprising the steps of:
   driving, from a first terminal of said superconducting material to a second terminal of said superconducting material, a superconducting current along a layer of superconducting material, said layer of superconducting material being in electrical contact with a layer of spin injection material capable of producing a spin-polarized current of spin-polarized carriers;
   electrically biasing said spin injection material with respect to said superconducting material so that a spin-polarized current of said spin-polarized carriers from said spin-injection material is injected into said superconducting layer between said first and second terminals, whereby said injected spin-polarized carriers reduce the order parameter of said superconducting layer between said first and second terminals.

3. The method of claim 2 wherein said spin-polarized carriers are electrons.

4. The method of claim 2 wherein said spin-polarized carriers are holes.

5. The method of claim 2, wherein said spin injection material is a ferromagnetic metal.

6. The method of claim 5, wherein said spin injection material is selected from the group consisting of iron, iron-based alloys, nickel, nickel-based alloys, cobalt and cobalt-based alloys, SmCo, and collosal magnetoresistive materials.

7. The method of claim 6, wherein said spin injection material is selected from the group consisting of iron, iron-based alloys, nickel, nickel-based alloys, cobalt and cobalt-based alloys, SmCo, and LaCaMnO.

8. The method of claim 2, wherein said spin injection material is a layer of a nonmagnetic metal in physical contact with a spin insulator layer, said spin insulator layer being sufficiently thin to allow carriers from said nonmagnetic metal to tunnel into said superconducting material.

9. The method of claim 8, wherein said spin insulator is magnetite.

10. The of claim 8, wherein said nonmagnetic metal is selected from the group consisting of gold, silver, aluminum, and mixtures thereof.

11. The method of claim 5, wherein a nonmagnetic metal buffer layer exists between said spin injection material and said superconducting material, so that said spin-polarized carriers injected from said spin injection material pass through said nonmagnetic buffer layer before reaching said superconducting material.

12. The method of claim 2, wherein said superconducting material is selected from the group consisting of Tl(BaSr)CaCuO superconductors, Hg(BaSr)CaCuO superconductors, BiSrCaCuO superconductors, and NdCeCuO superconductors.

13. Circuitry for suppressing the superconductivity of a superconducting material, comprising:
   a layer of a superconducting material having a first terminal and a second terminal opposite said first terminal
   a first biasing circuit electrically biasing said first terminal with respect to said second terminal so as to drive a superconducting current along said layer of said superconducting material;
   a layer of a spin injection material, capable of producing a spin-polarized current of spin-polarized carriers, in electrical contact with said superconducting material; and
   a second biasing circuit electrically biasing said layer of spin injection material with respect to said superconducting material so that a spin-polarized current of said spin-polarized carriers from said spin-injection material is injected into a portion of said superconducting layer between said first and second terminals.

14. The circuitry of claim 13, wherein said spin injection material is a ferromagnetic metal.

15. The circuitry of claim 14, wherein said spin injection material is selected from the group consisting of iron, iron-based alloys, nickel, nickel-based alloys, cobalt and cobalt-based alloys, SmCo, and colossal magnetoresistive materials.

16. The circuitry of claim 15, wherein said spin injection material is selected from the group consisting of iron, iron-based alloys, nickel, nickel-based alloys, cobalt and cobalt-based alloys, SmCo, and LaCaMnO.

17. The circuitry of claim 14, further comprising a buffer layer between said spin injection material and said superconducting material so that said spin-polarized carriers injected from said spin injection material will pass through said buffer layer before reaching said superconducting material, said buffer layer being a non-magnetic metal, a semiconductor, or a semimetal.

18. The circuitry of claim 17, wherein said buffer layer is non-magnetic.

19. The circuitry of claim 18, wherein said nonmagnetic metal is selected from the group consisting of gold, silver, aluminum, and mixtures thereof.

20. The circuitry of claim 18, wherein said buffer layer is a semiconductor or a semimetal.

21. The circuitry of claim 14, further comprising an electrically insulting layer between said spin injection material and said superconducting material, said insulator layer being sufficiently thin to allow spin-polarized carriers from said ferromagnetic metal to tunnel into said superconducting material.

22. The circuitry of claim 13, wherein said spin injection material is a layer of a nonmagnetic metal in physical contact with a spin insulator layer, said spin insulator layer being sufficiently thin to allow carriers from said nonmagnetic metal to tunnel into said superconducting material.

23. The circuitry of claim 22, wherein said spin insulator is magnetite.

24. The circuitry of claim 13, wherein said superconducting material is selected from the group consisting of YBaCuO superconductors, Tl(Ba,Sr)CaCuO superconductors, Hg(BaSr)CaCuO superconductors, BiSrCaCuO superconductors, and NdCeCuO superconductors.

* * * * *